United States Patent
Moon et al.

(10) Patent No.: US 7,495,592 B1
(45) Date of Patent: Feb. 24, 2009

(54) LOW-POWER VOLTAGE COMPARATOR BASED ON QUANTUM TUNNELING COUPLED TRANSISTORS

(75) Inventors: Jeong-Sun Moon, Moorpark, CA (US); Keh-Chung Wang, Thousand Oaks, CA (US)

(73) Assignee: HRL Laboratories, LLC, Malibu, CA (US)

( * ) Notice: Subject to any disclaimer, the term of this patent is extended or adjusted under 35 U.S.C. 154(b) by 498 days.

(21) Appl. No.: 11/261,746

(22) Filed: Oct. 27, 2005

(51) Int. Cl.
*H03M 1/00* (2006.01)
(52) U.S. Cl. .................................... 341/133; 341/155
(58) Field of Classification Search ................. 341/144, 341/133; 326/88; 327/143; 257/31, 401, 257/761
See application file for complete search history.

(56) References Cited

U.S. PATENT DOCUMENTS

| | | | |
|---|---|---|---|
| 5,329,165 A * | 7/1994 | Kao et al. ................. | 307/91 |
| 5,789,940 A * | 8/1998 | Taddiken ................. | 326/60 |
| 5,825,049 A | 10/1998 | Simmons et al. | |
| 6,110,393 A | 8/2000 | Simmons et al. | |
| 6,750,724 B1 | 6/2004 | Mori et al. | |
| 6,885,325 B2 * | 4/2005 | Omelyanchouk et al. ... | 341/133 |
| 6,929,987 B2 | 8/2005 | Moon | |
| 6,972,702 B1 | 12/2005 | Moon | |

OTHER PUBLICATIONS

T. P. E. Broekaert, et al., "A Monolithic 4 Bit 2 GSps Resonant Tunneling Analog-to-Digital Converter," *IEEE*, 1997, pp. 187-190, IEEE.

J. S. Moon, et al., "Unipolar complementary circuits using double electron layer tunneling transistors," *Applied Physics Letters*, Jan. 11, 1999, pp. 314-316, vol. 74, No. 2, American Institute of Physics.

Elliott R. Brown, et al., "Resonant-Tunneling-Diode Loads: Speed Limits and Applications in Fast Logic Circuits," *Digest of Technical Papers*, Feb. 20, 1992, pp. 142-143, Engineering Technologies—Session 8, Paper 8.6, IEEE International Solid-State Circuits Conference.

J. A. Simmons, et al., "Planar quantum transistor based on 2D-2D tunneling in double quantum well heterostructures," *Journal of Applied Physics*, Nov. 15, 1998, pp. 5626-5634, vol. 84, No. 10, American Institute of Physics.

Yukio Ikeda, et al., "A Consideration of the Compensation Method for the Gain Expansion Characteristics of Multi-Stage Amplifiers," *1997 Asia Pacific Microwave Conference*, 1997, pp. 1101-1103.

Pinaki Mazumder, et al., "Digital Circuit Applications of Resonant Tunneling Devices," *Proceedings of the IEEE*, Applications of RTD's, Apr. 1998, pp. 664-686, vol. 86, No. 4, IEEE.

(Continued)

*Primary Examiner*—Peguy JeanPierre
(74) *Attorney, Agent, or Firm*—Christie, Parker & Hale

(57) ABSTRACT

A voltage comparator including a quantum tunneling coupled transistor and a method for tuning the voltage comparator. The comparator includes a quantum tunneling coupled transistor coupled to a resistor and is capable of operating above 10 Giga-samples-per-second or a clock rate of 10 GHz. The comparator has a low power consumption of about 1 mW excluding the power required for clock generation and independent from the sampling rate. The threshold or reference voltage of the comparator is controllable by adjusting the pulse height of the clock signal. The comparator has relatively low hysteresis estimated at about 1 mV.

12 Claims, 23 Drawing Sheets

OTHER PUBLICATIONS

Jason Robertson, et al., "RTD/2-D MESFET Logic Element for Compact, Ultra-Low-Power Electronics," *IEEE Transactions on Electron Devices*, Jul. 1997, pp. 1033-1039, vol. 44, No. 7, IEEE.

J. S. Moon, et al., "Planar Tunneling-coupled Field-Effect Transistor for Low-power Mixed-Signal Applications," 2005, 2 pages, HRL Laboratories, LLC.

* cited by examiner

LOW-POWER VOLTAGE COMPARATOR BASED ON QUANTUM TUNNELING COUPLED TRANSISTORS

STATEMENT REGARDING FEDERALLY SPONSORED RESEARCH OR DEVELOPMENT

This invention was made with U.S. government support under Contract No. WC53361 awarded by the National Reconnaissance Office (NRO). The U.S. government has certain rights to this invention.

BACKGROUND OF THE INVENTION

This invention relates to the field of voltage comparators and, more particularly, to a low-power voltage comparator that may be used in analog-to-digital converters (ADCs).

A voltage comparator is a generic electronic device that compares the voltages of its two analog inputs at a specified time and provides a digital output based on the comparison result. A comparator is a key component in ADCs which are used commonly in communication, radar, medical, and instrumentation systems. Major performance criteria of a comparator are power, sampling rate, sensitivity, input bandwidth, and voltage range. High-speed and low-power comparators are always in high demand, especially in mobile systems. They are conventionally implemented with the families of bipolar junction transistors (BJTs) or field effect transistors (FETs). A typical comparator may include seven transistors and 3 resistors, and consumes about 10 mW to 100 mW of power depending on the sampling rates.

For many applications, the battery power provided to the comparator is finite. Therefore, there is always a need for comparators that include transistors that can operate using less power.

Further, each transistor contributes its parasitic capacitance and resistance to the overall comparator circuit. Therefore, as the number of transistors increases, the sampling rate of the analog-to-digital converter using the comparator decreases. Accordingly, there is a need for comparator circuits that use fewer transistors and therefore contribute less parasitics. There is also a need for faster transistors that can increase the sampling rate of the comparator circuits.

Innovative approaches to increase the speed of ADCs while lowering their power consumption include using a superconductor, a single electron transistor (SET), or a quantum tunneling transistor based device, such as a resonant tunneling diode (RTD).

Quantum tunneling transistors may be used as on-off switches. The quantum tunneling transistors exploit an electron's ability to pass through normally impenetrable barriers, allowing for fabrication of faster transistors that can be mass-produced with current nanotechnology. The flow of electrons is controlled between two GaAs layers separated by an AlGaAs barrier. Although the electrons in GaAs ordinarily do not have enough energy to enter the AlGaAs barrier, the layers are very thin so that they are comparable in size to the electron wavelength. At small thicknesses, the electrons are considered as waves rather than particles and can spread into the barrier and, with an appropriate voltage applied, proceed out the other side. In this process, the electron waves do not collide with impurity atoms. This is in contrast to a traditional transistor's particle-like electrons, which are slowed down by collisions with the impurity atoms doping the lattice. Transistors using this approach, switch on and off many times faster than current GaAs channel field effect transistors.

RTD devices take advantage of quantum mechanical effects such as electron resonant tunneling. An example of a RTD is disclosed in U.S. Pat. No. 5,825,049, to Simmons et al. A regular RTD is a two terminal device which acts similarly to a diode and has a resistance that varies nonlinearly with an applied bias. The lack of a third terminal that imposed a limitation on the usefulness of a RTD was addressed by the '049 patent that discloses a device with a gate. However, fabrication of such devices is not trivial. As complexity of fabrication increases, yield decreases.

Therefore, a need still exists for a low power voltage comparator using components with a simplified fabrication process that may be used in ADC devices.

SUMMARY OF THE INVENTION

The current invention presents a low power voltage comparator using an alternative quantum tunneling coupled transistor. The quantum tunneling coupled transistor has a simplified fabrication process and its operation may be controlled by a gate terminal. The quantum tunneling coupled transistor operates by gate terminal control of interlayer tunneling between two separate two-dimensional electron gas layers independently coupled to the source terminal and the gate terminal.

Furthermore, the embodiments of the invention present a novel method of controlling the threshold voltage (or reference voltage) of the comparator using the quantum tunneling coupled transistor. By adjusting the threshold voltage of the quantum tunneling coupled transistor, this method makes it possible to use the same type of quantum tunneling coupled transistor for digitizing an analog signal into various digital levels.

Embodiments of the present invention include a voltage comparator that includes a quantum tunneling coupled transistor having a collector terminal, a source terminal and a gate terminal, and a load resistor coupled to the collector terminal. The comparator receives an input voltage at the gate terminal and provides an output voltage at the source terminal. The output voltage changes from a first level to a second level different from the first level when the input voltage exceeds a reference voltage of the quantum tunneling coupled transistor. The load resistor may have an exemplary value of 400Ω. The load resistor may be coupled to a clock generator and the reference voltage may be adjustable according to the clock generator high voltage level. The clock generator may have a high voltage level of 1V and a low voltage level of 100 mV. The clock generator may be operated at a rate of 100 GHz.

Another embodiment presents a method for tuning a reference voltage of a voltage comparator. The voltage comparator includes a quantum tunneling coupled transistor. The quantum tunneling coupled transistor has a collector terminal, a source terminal and a gate terminal. The comparator receives an input voltage and a clock signal and the comparator switches at the input voltage above the reference voltage. The method includes tuning the input voltage for varying a collector to source current of the quantum tunneling coupled transistor, and tuning a logic-high level of the clock signal for moving a load line of the quantum tunneling coupled transistor. The reference voltage corresponds to an intersection of a current peak and a load line. The logic-high level of the clock may be 1V. The comparator may further include a load resistor coupled to the quantum tunneling coupled transistor, and the load resistor may have a value of 400Ω. The clock may be operated at a rate of 10 GHz. The clock may alternatively be operated at a rate of 50 GHz or at a rate of 100 GHz.

Another embodiment presents an analog to digital converter including a network of quantum tunneling coupled transistors coupled together, a network of distributive resistors, each distributive resistor coupling together two adjacent quantum tunneling coupled transistors, a network of tail resistors, each tail resistor coupled between one of the quantum tunneling coupled transistors and ground, and a network of load resistors, each load resistor coupled between one of the quantum tunneling coupled transistors and one of the distributive resistors. The network of distributive resistors is adapted for receiving an input voltage and providing progressively reducing fractions of the input voltage as a reference voltage to the quantum tunneling coupled transistors. Each quantum tunneling coupled transistor is adapted to receive an analog input at one terminal and to produce a digital output at another terminal.

BRIEF DESCRIPTION OF THE DRAWINGS

FIG. 2 shows current-voltage characteristics of the TCT of FIG. 1a.

DETAILED DESCRIPTION

An alternative quantum tunneling device, a process for fabrication of this device, and an analog-to-digital converter developed based on this device are disclosed in U.S. Pat. No. 6,929,987 and U.S. patent application Ser. No. 10/869,014 both to Moon, the entire contents of both of which are incorporated by reference into the present application. The '987 patent and the '014 application are also assigned to the assignee of the present invention. The quantum tunneling device of Moon also utilizes resonant tunneling characteristics of electrons and yields a resonant tunneling transistor (RTT). The device of Moon is fabricated by an improved method that enables electrically tunable resonant tunneling between closely coupled channels without a complex backside process.

The quantum tunneling device disclosed in '987 and '014 may be called a quantum tunneling coupled transistor (TCT). The operation of TCT is based on gate-control of interlayer tunneling between two separate two-dimensional electron gas (2DEG) layers that are each independently coupled to electrical contacts. Because TCTs may be fabricated in a low dimensional (not in three-dimension) form, allowed energy states of the 2DEGs in quantum wells are quantized. The interlayer tunneling requires external transduction either electrically or optically in order to meet energy and momentum conservation. For example, in TCTs, two separate 2DEG layers have different carrier densities of n1 and n2. When n1>n2, then a finite interlayer tunneling gap will exist due to the two-dimensional nature of the 2DEG. Consequently, TCTs are nominally in off-states and no current flows between the electrical contacts. The control gate may be pulsed negative electrically in order to make the carrier densities equal. When n1=n2, the quantum mechanical tunneling is switched on and the TCT is in an on-state. The control gate voltage needed for switching may be referred to as the tunneling voltage. When the applied control gate pulse becomes more negative, the TCT will enter an off-state because n1<n2. Therefore, unlike the conventional diode-based switches which operate in off-on mode, TCTs operate in a unique off-on-off mode, exhibiting two thresholds and both polarities of device transconductance. Because both carrier densities n1 and n2 can be independently changed by external gate bias, implementation of an additional backside gate may also be added that enables control of the carrier density n2 independently. Applying a voltage to the additional backside gate changes the magnitude of the electrical pulse needed at the control gate on the front or top side to switch the TCT on and off. This allows TCTs with a continuous electrically tunable tunneling voltage.

Figure 1A:
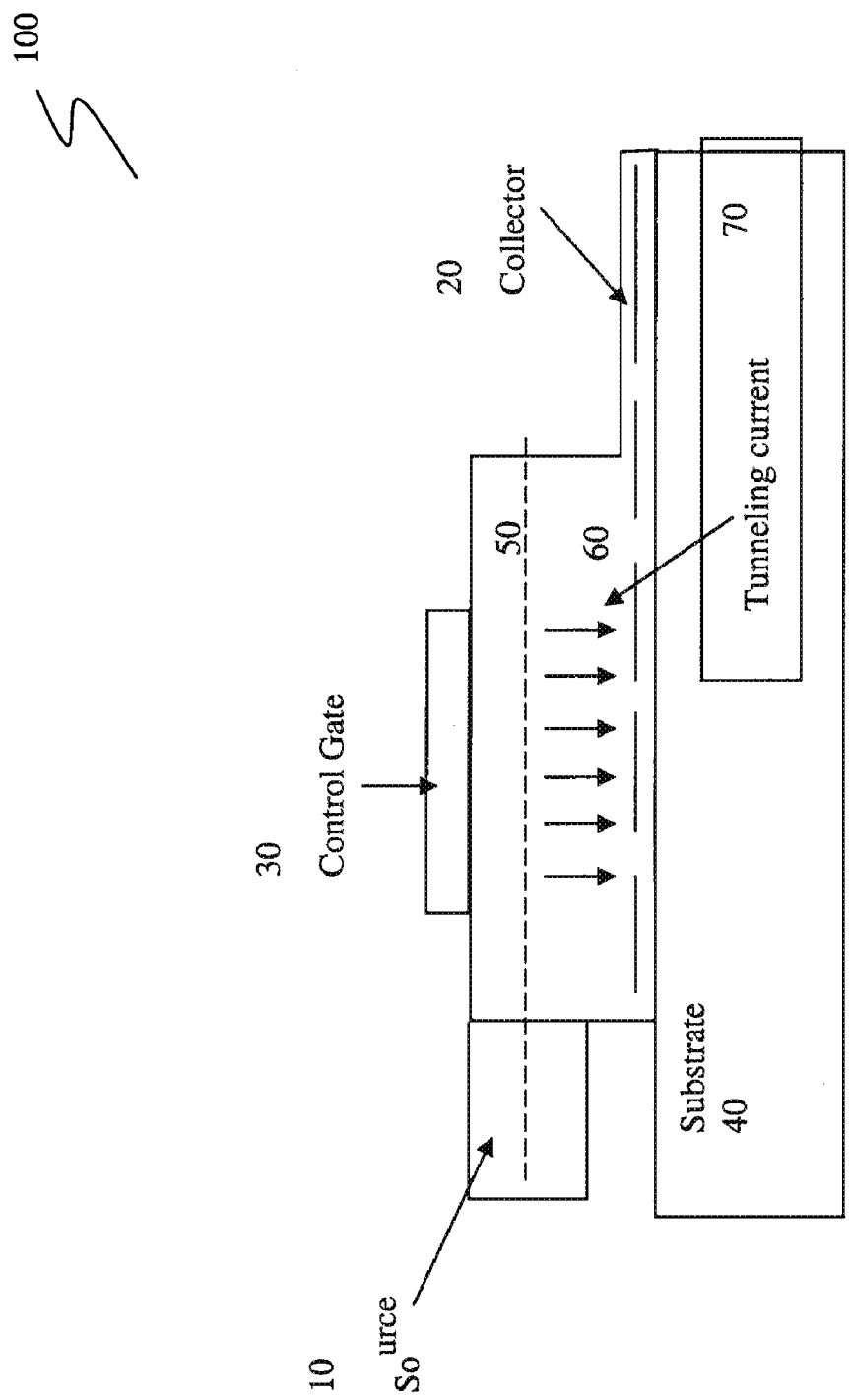
FIG. 1a shows a schematic representation of a quantum tunneling coupled transistor (TCT) according to an exemplary embodiment of the present invention.
Figure 1B:
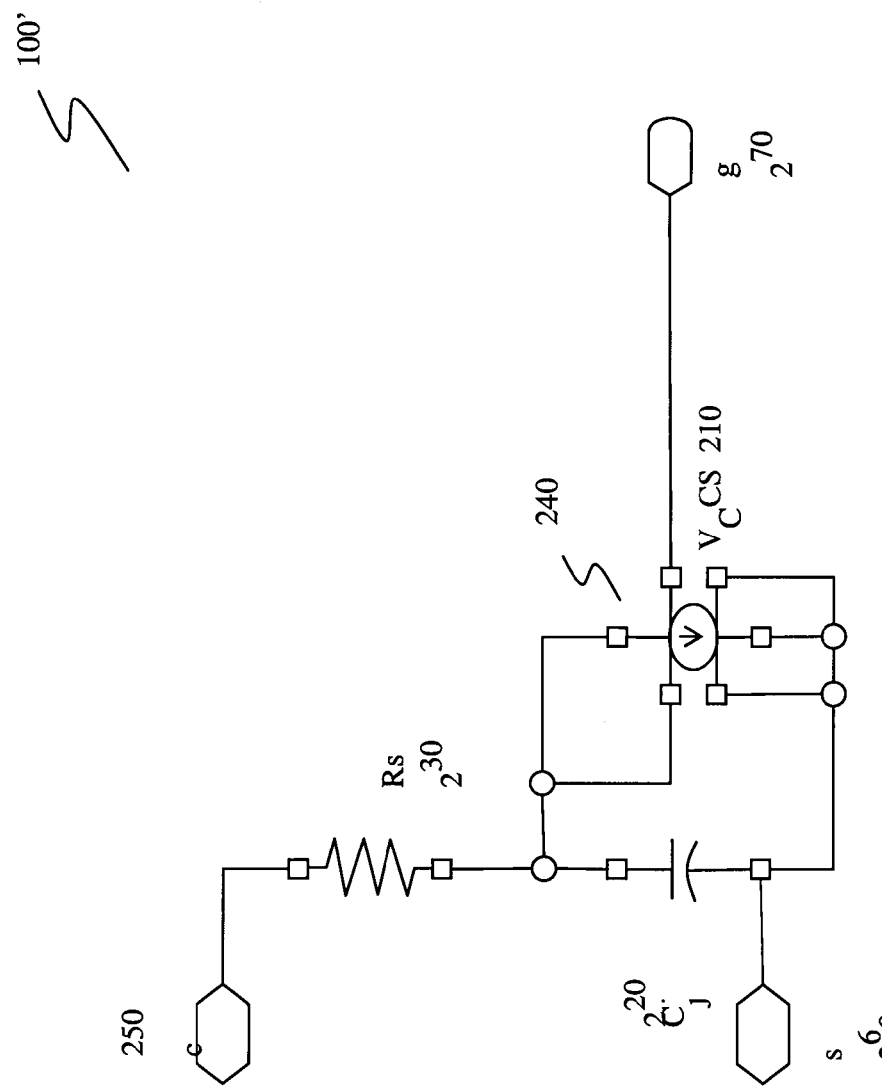
FIG. 1b shows a large-signal model of a TCT according to an exemplary embodiment of the present invention.

FIG. 1a and FIG. 1b display the device schematic representation and I-V characteristics of a TCT 100. The TCT 100 shown in FIG. 1a includes a source electrode 10, a collector electrode 20, a control gate 30, and a substrate 40. The collector 20 is deposited on the substrate 40. Biasing the TCT creates a source electron layer 50 at the source level and a collector electron layer 60 at the collector level. The control gate 30 facilitates continuous electrical tuning of the tunneling 70 between source layer 50 and collector layer 60.

The device physics of a RTD device is disclosed in the U.S. Pat. No. 5,825,049, to Simmons et al., the entire contents of which is incorporated by reference into the current application. In the '049 patent to Simmons that was also discussed above, a double electron layer tunneling device is presented that includes a control gate for controlling the allowed energy states of the emitter layer and enabling the device to be used as a transistor. The '049 patent calls its device a double electron layer tunneling transistor (DELTT). A fabrication process for DELTT is disclosed in U.S. Pat. No. 6,110,393 to Simmons et al., the entire contents of which is also incorporated by reference into the current application. The '087 patent to Moon presents a device with a simpler fabrication process by using different material.

FIG. 1b shows a large-signal model 100' of the TCT 100. The TCT model 100' includes a voltage-controlled-current-source (VCCS) 210, a junction capacitor (Cj) 220 and a series resistor (Rs) 230. Cj 220 and Rs 230 represent the parasitic capacitance and resistance of the TCT 100. The junction voltage across collector (C) 250 and source (S) 260 is Vc and the control voltage at the gate 270 is Vg. The output current 240 flowing from positive electrode negative electrode of the VCCS 210 depends on two controlling voltages Vc and Vg.

Those skilled in the art appreciate that the analog behavioral model Verilog-A® may be used to develop the large-signal model 100' for the TCT 100. This model 100' of the TCT 100 may be used for SPICE® simulations of circuits including the TCT 100 such as a comparator circuit 300 shown in FIG. 3. Once proper operation of the comparator 300 using the large-signal model 100' of the TCT 100 is confirmed, then further SPICE® simulations may be carried out to determine operating principles of the TCT 100. Verilog-A® allows using mathematical expressions to represent the voltage dependence of the output current 240. For example, a mathematical expression that is based on actual measurement of fabricated TCTs and expected improvements may be used in the model to represent the voltage dependence of the current in the voltage controlled current source. Further, the model may be used with Virtuoso Spectre® from Cadence.

Figure 2:
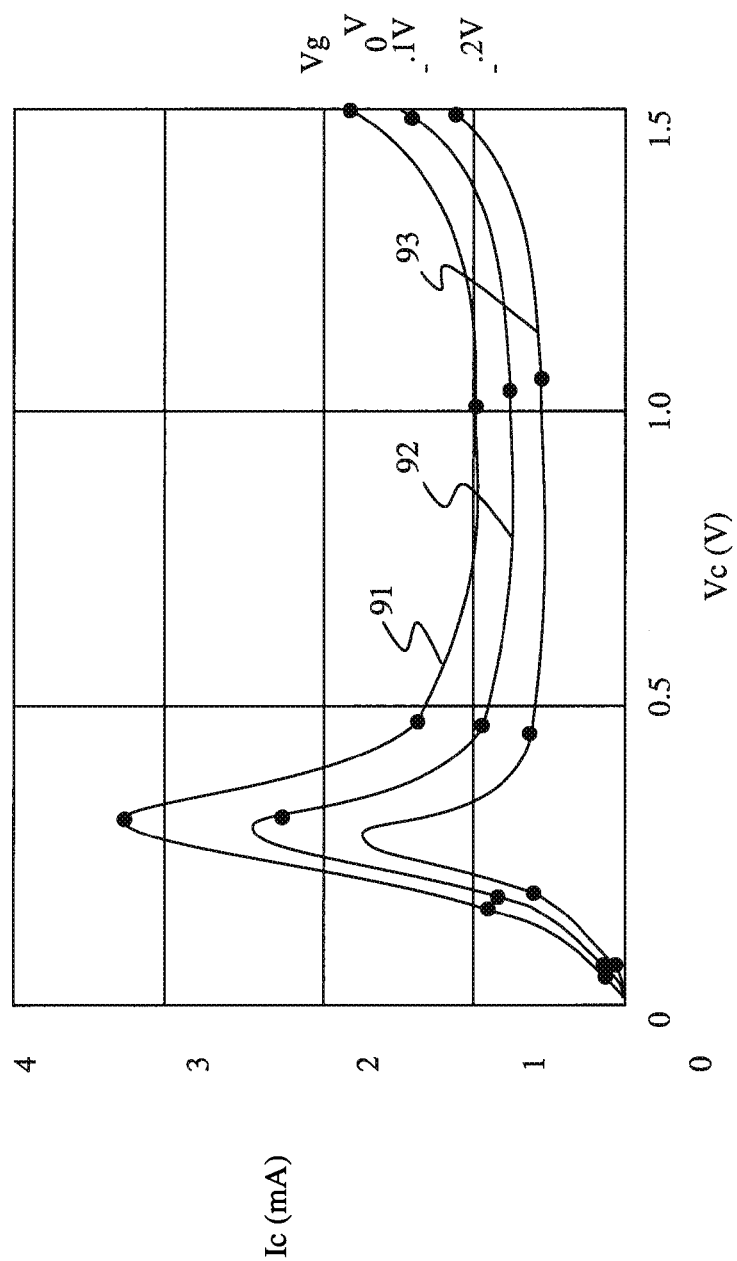

FIG. 2 is a plot of the TCT collector current, Ic, in units of mA versus the collector voltage, Vc, in volts, when the gate voltage, Vg, has 3 values of 0 volts, −0.1 volts, and −0.2 volts. The three different gate voltages Vg shown result in 3 different collector current curves 91, 92, 93. As the figures show, the current-voltage characteristics of the TCT 100 are highly nonlinear. For the gate voltages Vg given on the figure, the collector current Ic spikes at a voltage between 0 and 0.5 volts and then plateaus before starting to increase at 1.5 volts again. Further, the collector current Ic increases with increasing gate voltage Vg.

FIG. 2 uses values of 1 ohm for the Rs 230 and 8 fF for the Cj 220 for the exemplary TCT 100 shown in FIG. 1b.

Figure 3:
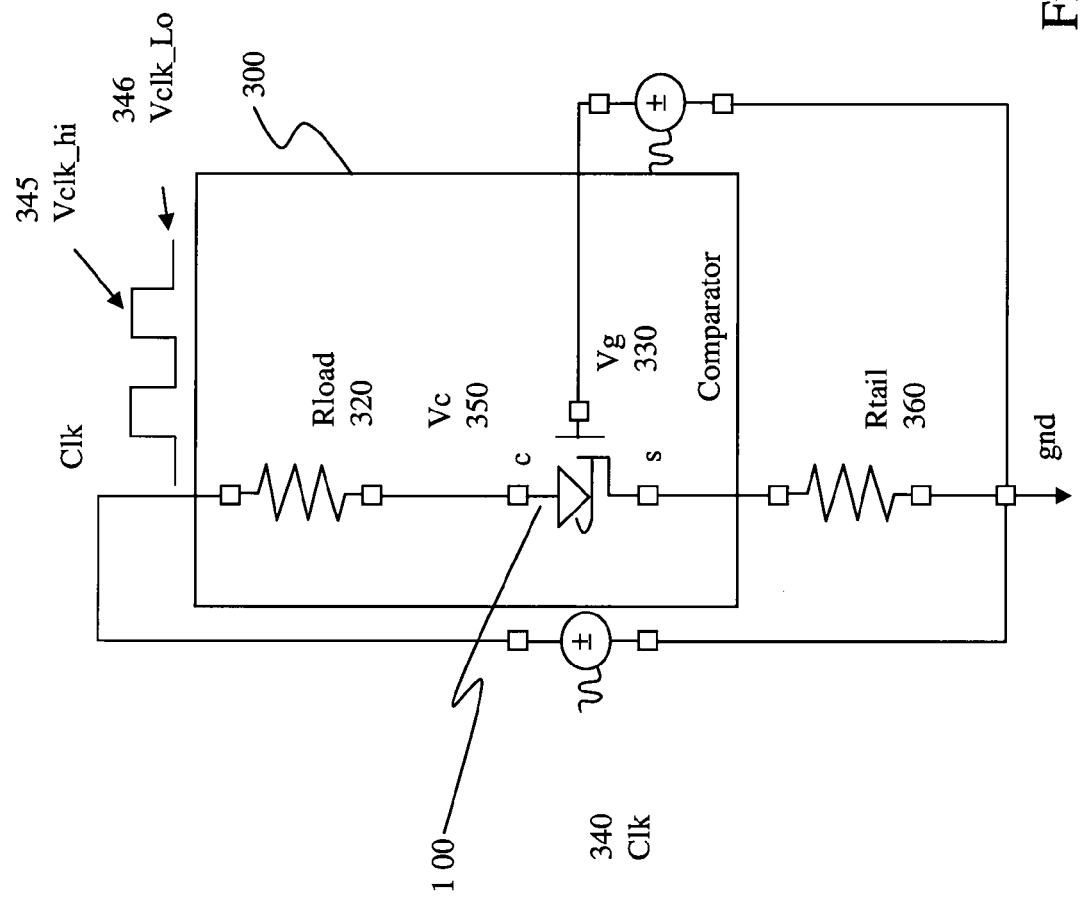
FIG. 3 shows a TCT comparator circuit according to exemplary embodiment of the present invention.

FIG. 3 shows a circuit for a TCT comparator 300 according to an embodiment of the invention. The comparator 300 includes a TCT 100 and a load resistor (Rload) 320 that is coupled to the collector node of the TCT 100. Analog input Vg 330 is applied to the control gate of the TCT 100. One terminal of the Rload 320 is coupled to the collector node of the TCT 100 and the other terminal of the Rload 320 is coupled to a clock generator Clk 340. The ClK 340 generates pulses swinging between the voltages of clock logic-high Vclk_hi 345 and clock logic-low Vclk_lo 346. The collector node is the output Vc 350 of the comparator 300. Finally, the TCT source node is coupled to the ground through a tail resistor Rtail 360. Tail resistors are generally used for damping current fluctuations in a circuit. The value of Rtail 360 in one exemplary embodiment may be about 1 mΩ.

Figure 4:
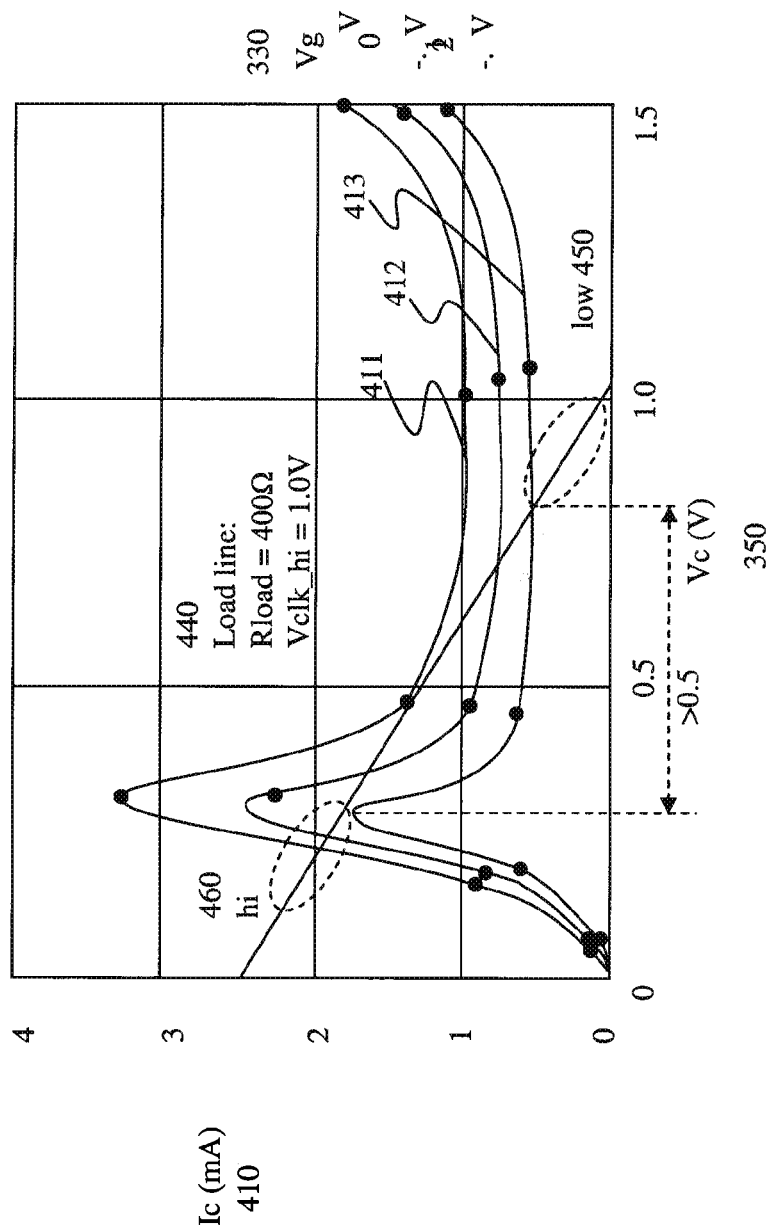
FIG. 4 shows current-voltage characteristics of the TCT used in the comparator circuit of FIG. 3 superimposed on a load line of the comparator circuit of FIG. 3.

FIG. 4 shows the operational characteristics of the comparator 300 of FIG. 3. The current-voltage characteristic curves 411, 412, 413 depict the collector current Ic 410 versus the collector to source voltage Vc 420 while the gate voltage Vg 330 is varied. The gate voltage Vg 330 is the analog input of FIG. 3. FIG. 4 also includes a load line 440 corresponding to a Rload 320 of 400Ω and a Vclk_hi of 1V. The load line 440 intersects the horizontal voltage axis at 1V and the vertical current axis at 2.5 mA.

The TCT comparator 300 used to obtain the I-V characteristic curve of FIG. 4 includes a TCT 100 with an active area of 1 μm×10 μm. When the analog input Vg 330 is low, the TCT 100 operates in the range of low collector current Ic 410 as indicated by the dashed oval area "low" 450. When the analog input Vg 330 reaches slightly above −0.2V the peak of tunneling current Ic 410 touches the load line 440 and a high current solution is activated. At this point in time the TCT 100 rapidly moves into high Ic operation range as indicated by the dashed oval "hi" 460, and the output voltage Vc 350 changes by a relatively large amount (more than 0.5V). The comparator 300 possesses a built-in threshold voltage that is also called a reference voltage Vref 510 (shown in FIG. 5). At this time, the Vg or Vg 330 is equal to Vref 510. Effectively, the comparator 300 compares Vg 330 with Vref and generates a "latched" digital output Vc 350.

Figure 5:
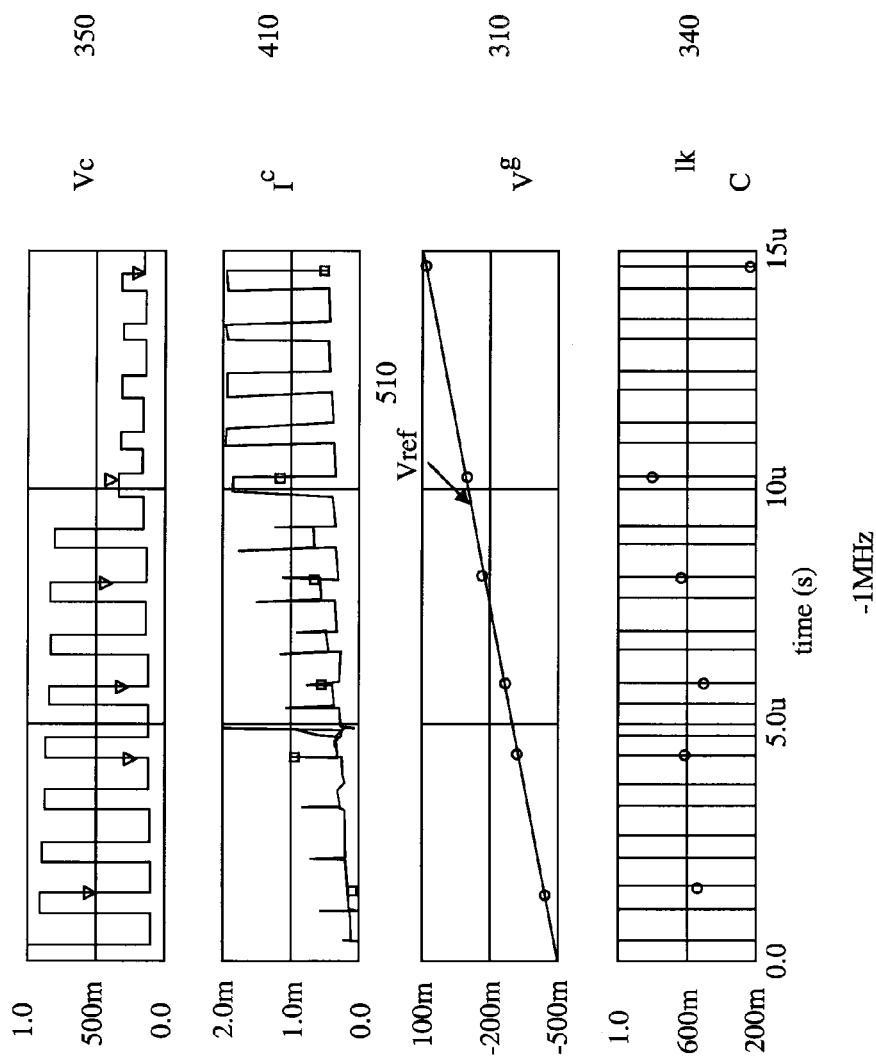
FIG. 5 shows SPICE® simulation results of a TCT comparator of the present invention operating at low frequencies.
Figure 6A:
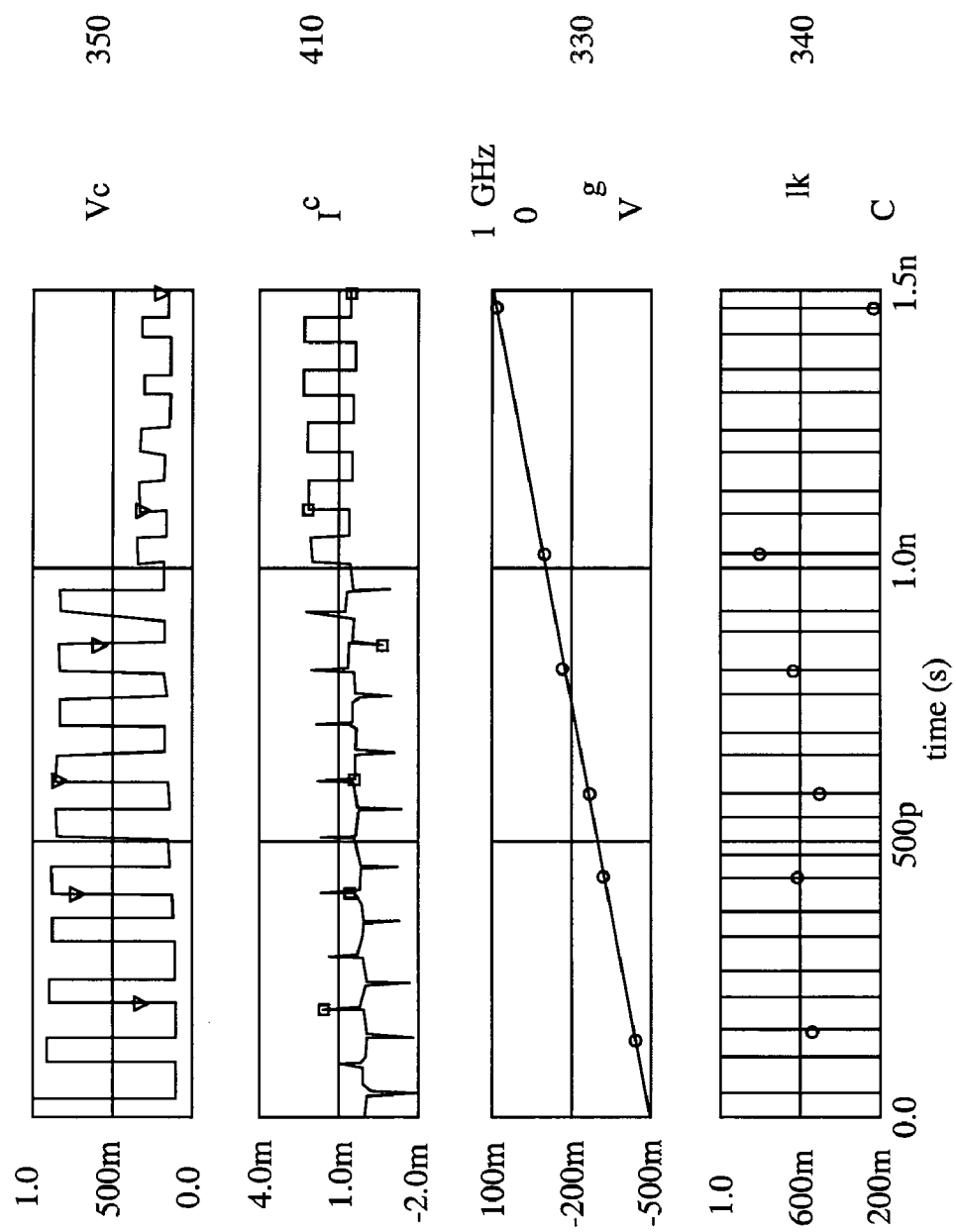
FIGS. 6A, 6B, 6C, and 6D show SPICE® simulation results of a TCT comparator of the invention operating at various frequencies.
Figure 6B:
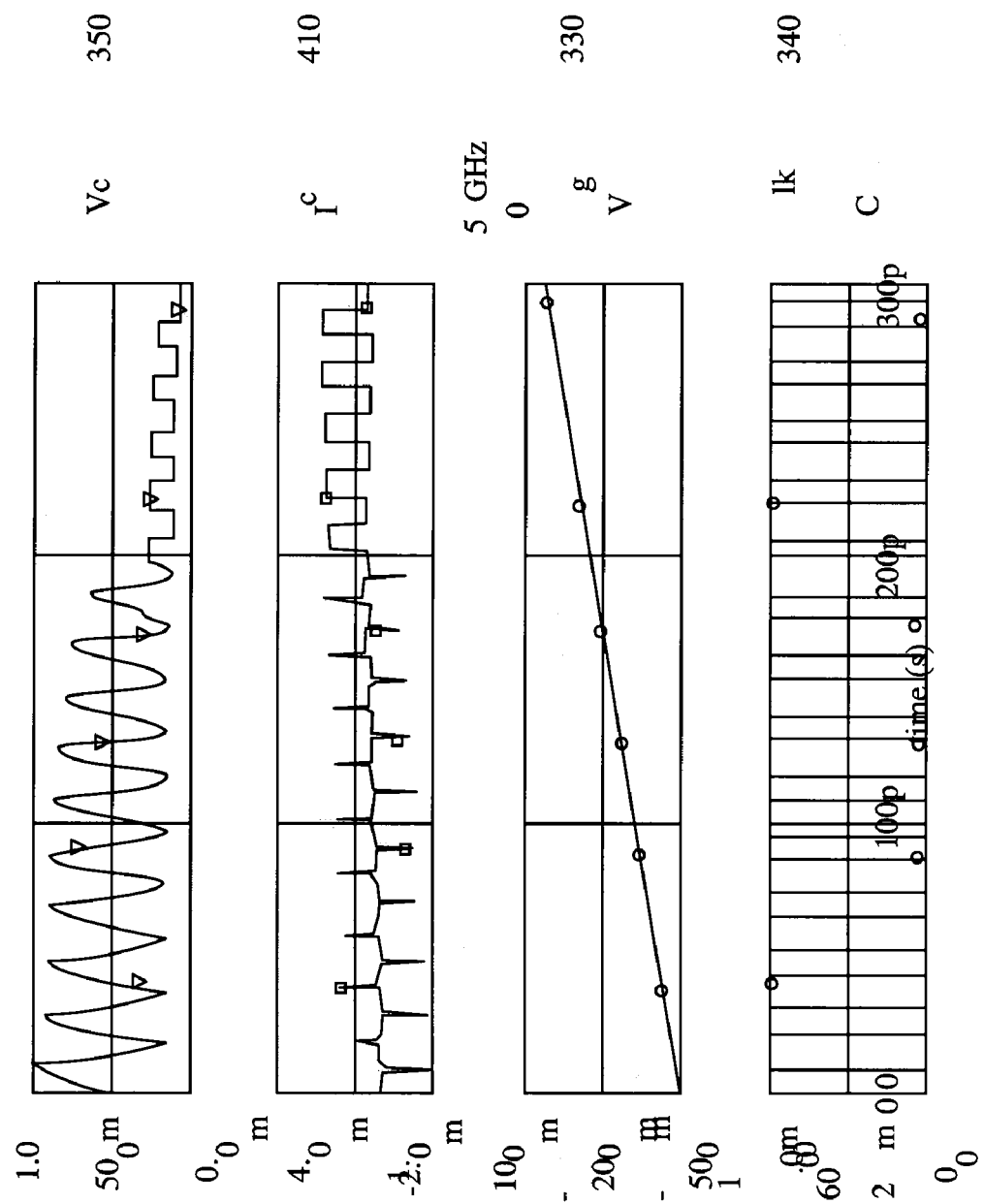
Figure 6C:
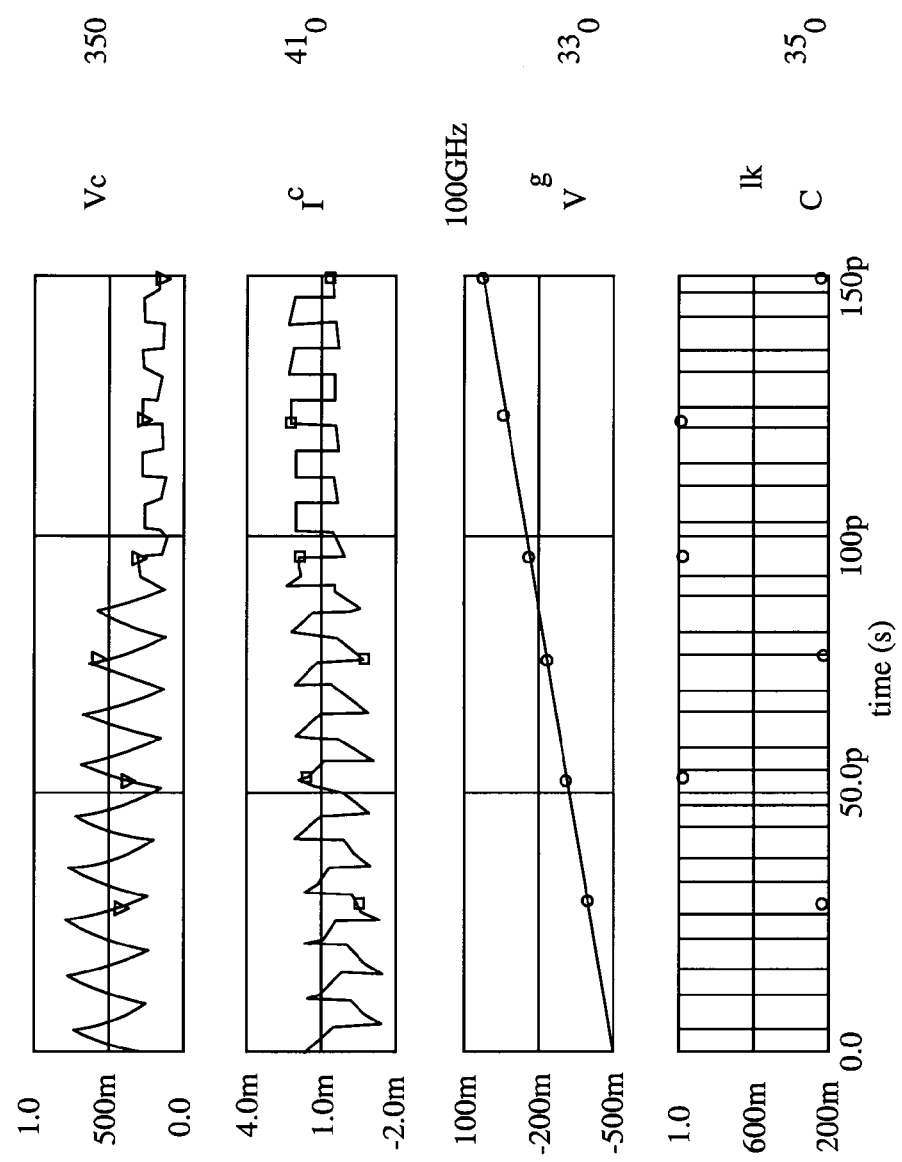
Figure 6D:
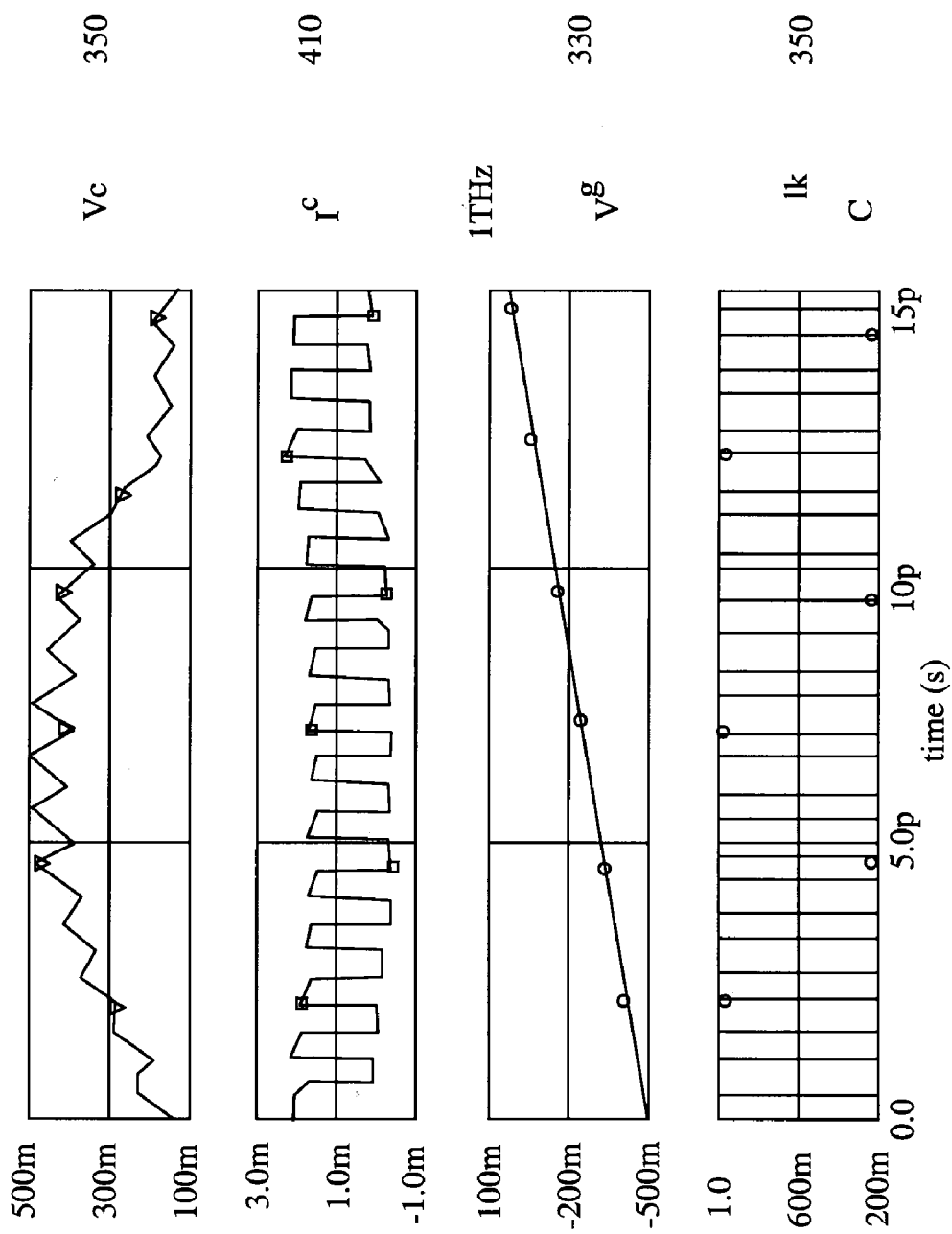

FIG. 5 Shows the results of a SPICE® simulation of the TCT comparator circuit 300 of FIG. 3 operating at a relatively low clock speed of approximately 1 MHz. FIG. 5 includes 4 windows that, from top to bottom, show the time (μS) along the horizontal axis and the output voltage Vc 350, the TCT current Ic 410, the input voltage Vg 330, and the clock generator Clk 340 waveform on their vertical axes.

In the SPICE® simulation whose results appear in FIG. 5, the clock Clk 340 was operated at about 1 MHz, with Vclk_hi 345 and Vclk_lo 346 of 1V and 100 mV, respectively. A ramp input voltage Vg 330 varies from −500 mV to 0V over a period of 15 μs. The output voltage Vc 350 and the current Ic 410 through TCT 100 are shown in the top two windows of FIG. 5. The comparator 300 operates during high periods of the clock generator Clk 340 and has a "return-to-zero" type of output. When Vg 330 crosses the threshold voltage or the reference voltage Vref 510 the output voltage Vc 350 drops abruptly. The simulated current Ic 410 showed an average power consumption of about 1 mW which is obtained by a product of 0.5×1V×2 mA. This calculation is based on the equation for average power $P_{avg}=0.5VI$.

FIGS. 6A, 6B, 6C, and 6D shows SPICE® simulation results for operating the TCT comparator 300 at four different operation speeds or clock rates of 10 GHz, 50 GHz, 100 GHz, and 1 THz, respectively. Four waveform windows are included for each operation speed that show the output voltage Vc 350, the collector current Ic 410, the input voltage Vg 330, and the clock generator Clk 340 waveforms.

The speed performance of the TCT comparator 300 depends on the parasitic capacitance of TCT 100 and the associated wiring. In an exemplary simulation scenario, a parasitic capacitance Cj 220 of 8 fF to 16 fF and a parasitic resistance Rs 230 of about 10Ω were estimated for a TCT 100 of active area 1 μm'10 μm. Because Rload 320 of the comparator 300 was selected to be 400Ω, the parasitic resistance Rs 230 had a minimal impact on the speed performance of the comparator 300. SPICE® simulations of the comparator 300, whose results appear in FIGS. 6A, 6B. 6C, and 6D, were carried out with Cj=8 fF.

These simulations show that the comparator 300 could operate even at 100 GHz. As shown in the figures corresponding to clock rates of 10 GHz, 50 GHz, and 100 GHz, the output voltage Vc 350 drops measurably once the input voltage Vg 330 exceeds the threshold or reference voltage Vref 510. At the higher clock rate of 1 THz shown in FIG. 6D, however, this relationship between the input voltage Vg 330 and the output voltage Vc 350 no longer exists and the output voltage Vc 350 stays high a few pico-seconds after the input voltage Vg 330 has exceeded Vref 510.

With a higher parasitic capacitance Cj 220, for example with Cj of 16 fF, the performance of the comparator 300 may deteriorate at clock frequencies lower than 100 GHz.

As expected from the principles described above, the average power consumption corresponding to the above simulations of various frequencies is about 1 mW independent of clock frequency in the first order.

Figure 7:
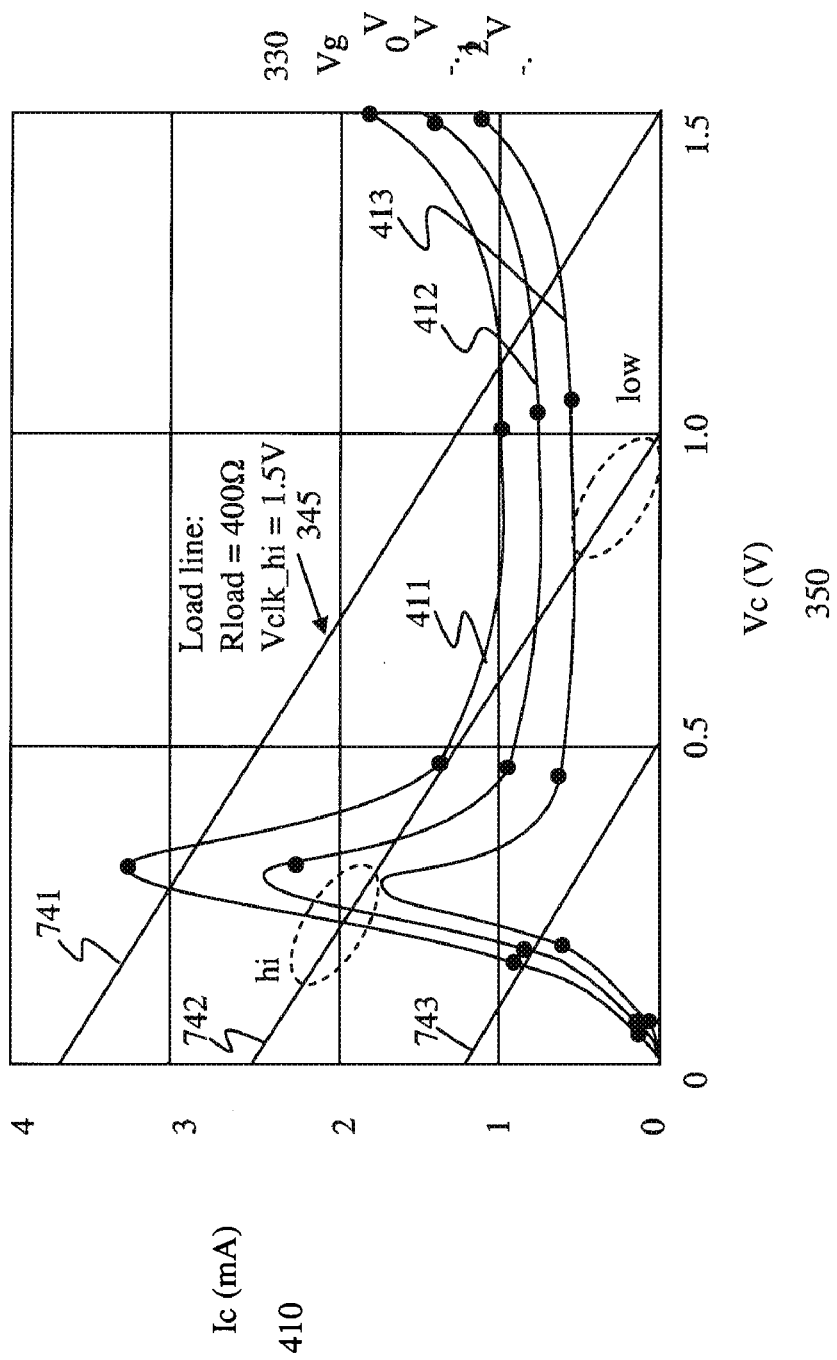
FIG. 7 shows the current-voltage characteristics of the TCT used in the comparator circuit of FIG. 3 superimposed on three different load lines in order to show tuning of the TCT comparator.

Controlling or tuning the reference voltage Vref 510 of the TCT comparator 300 is challenging given the simplicity of this TCT comparator design. An ADC using multiple comparators requires different reference voltages for the comparators. FIG. 7 shows an approach for providing tuning.

FIG. 7 shows a method for tuning a TCT comparator 330 reference voltage Vref 510. By tuning the logic-high voltage of the clock, Vclk_hi 345, the load line is shifted. Further, as the input Vg or gate voltages Vg 330 changes, the tunneling currents Ic 411, 412, 413 also change. So, by tuning the voltage of the clock, the peak tunneling currents Ic 411, 412, 413 intersect load lines 741, 742, 743 at different voltages thus tuning the reference voltage Vref.

FIGS. 8A, 8B, 8C, and 8D show the results of SPICE® simulations of the TCT comparator 330 with different values of Vclk_hi 345. The simulations demonstrate that the reference voltage Vref 510 can be tuned by tuning the Vclk_hi 345 values.

FIGS. 8A, 8B, 8C, and 8D include the results of four sets of simulations corresponding to logic-high voltages of 0.5V, 0.75V, 1.0V, and 1.5V for Vclk_hi 345. The threshold or reference voltage Vref 510 changes correspondingly. The reference voltage Vref 510 may be identified on the third waveform plot of each group corresponding to the input voltage Vg 330 at the time when the output voltage Vc 350, shown on the first waveform plot, suddenly falls.

Figure 8A:
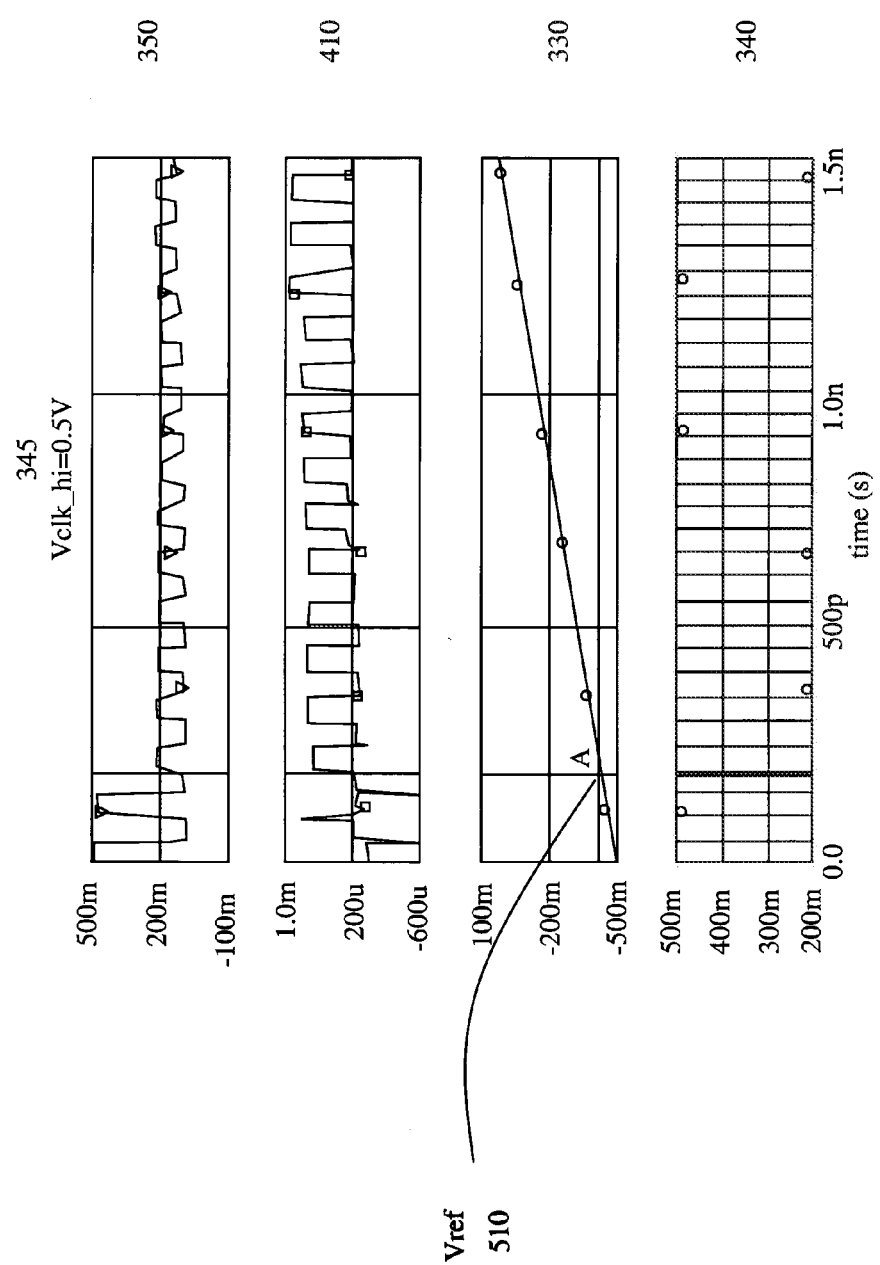
FIGS. 8A, 8B, 8C, and 8D show SPICE® simulation results of a TCT comparator at various clock logic-high voltages in order to show tuning of the TCT comparator.
Figure 8B:
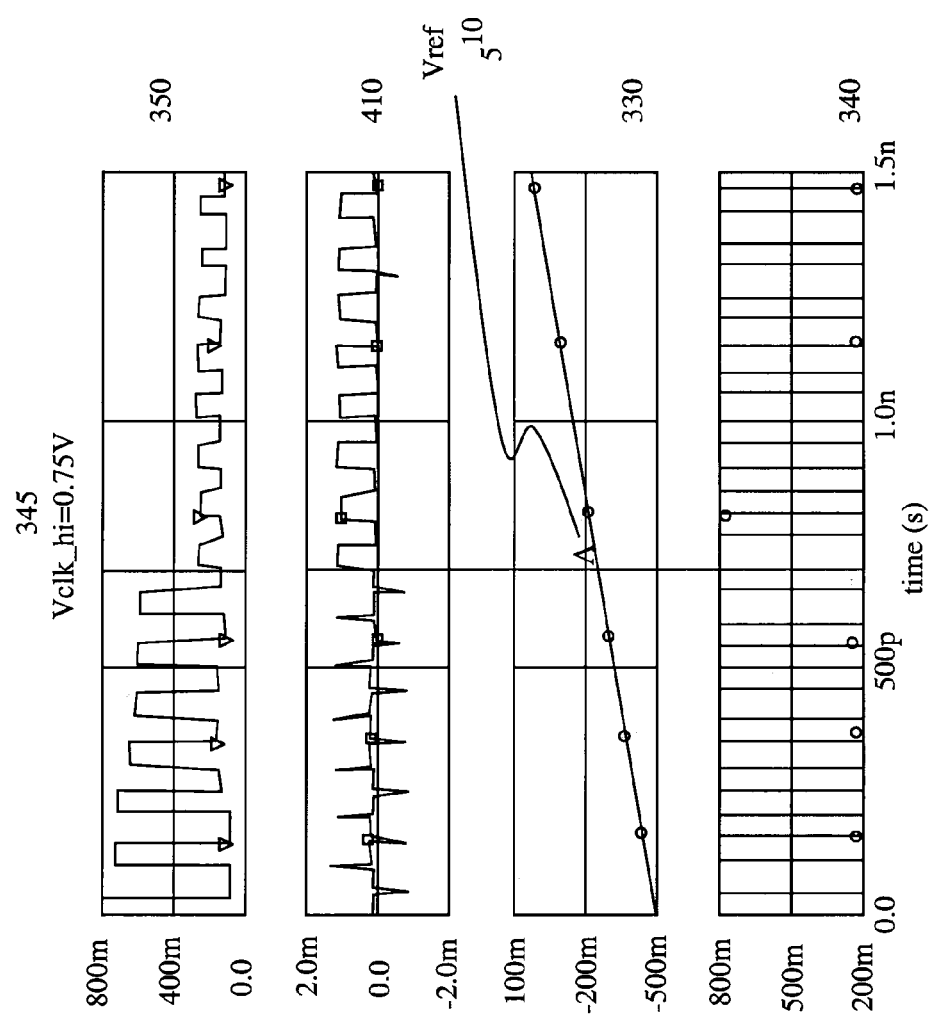
Figure 8C:
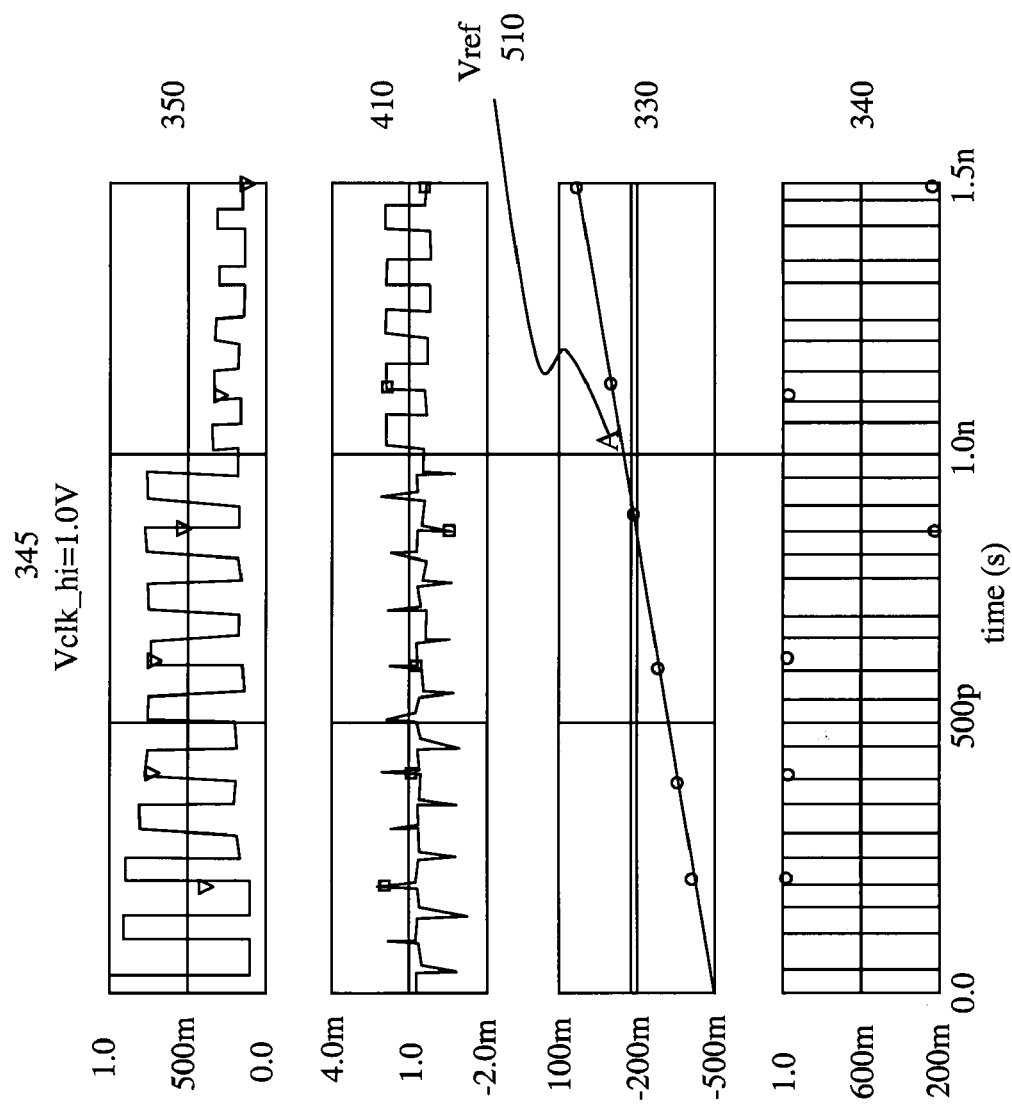
Figure 8D:
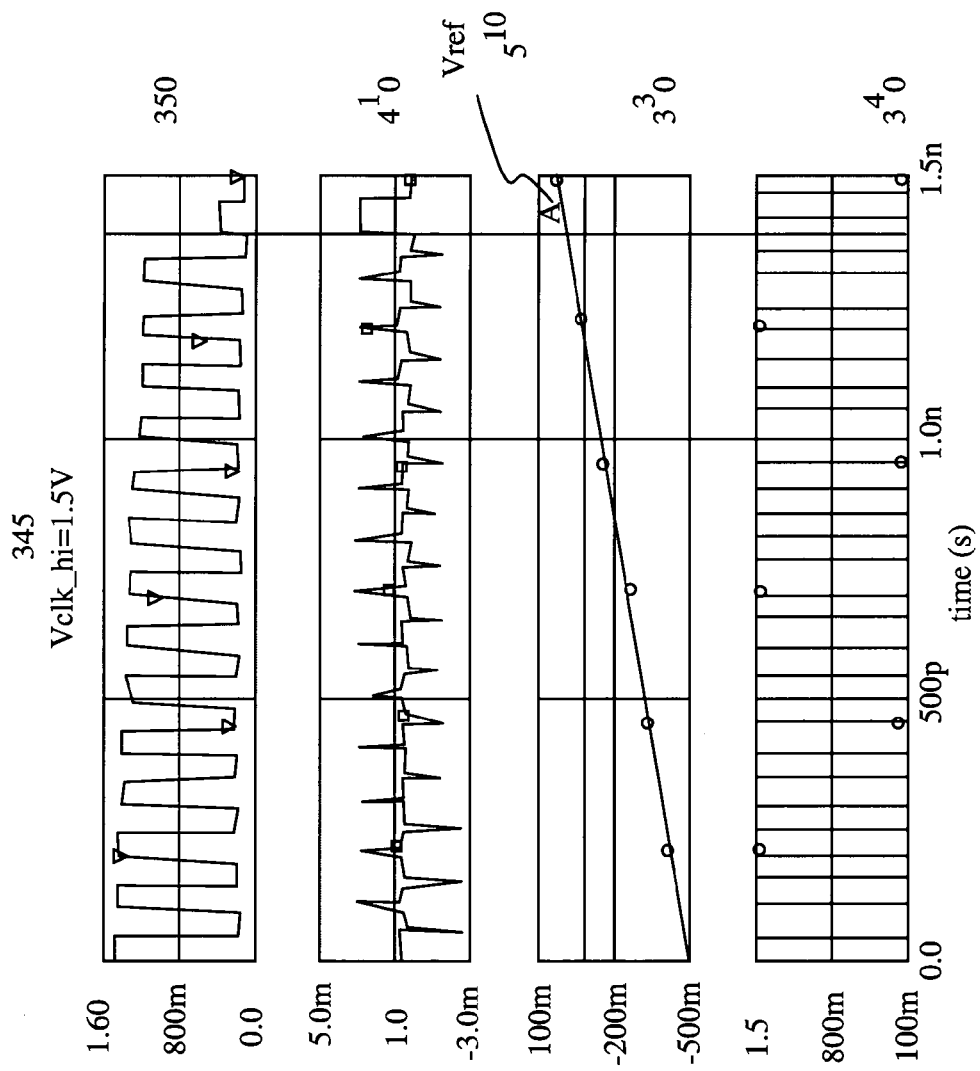

For example, for the logic-high voltage Vclk_hi of 0.5V shown in FIG. 8A, the reference voltage Vref 510 occurs at about 100 pS after time 0 and corresponds to a voltage of approximately −0.5V (−440 mV as shown on the plot). On the other hand, for the logic-high voltage Vclk_hi of 1.5V shown in FIG. 8D, the reference voltage Vref 510 occurs at about 1400 pS (1.4 nS) and corresponds to a voltage of approximately −0.2V (−200 mV). So, increasing the logic-high voltage Vclk_hi 345 of the clock generator Clk 340 results in a corresponding increase in the reference voltage Vref 510.

Figure 9:
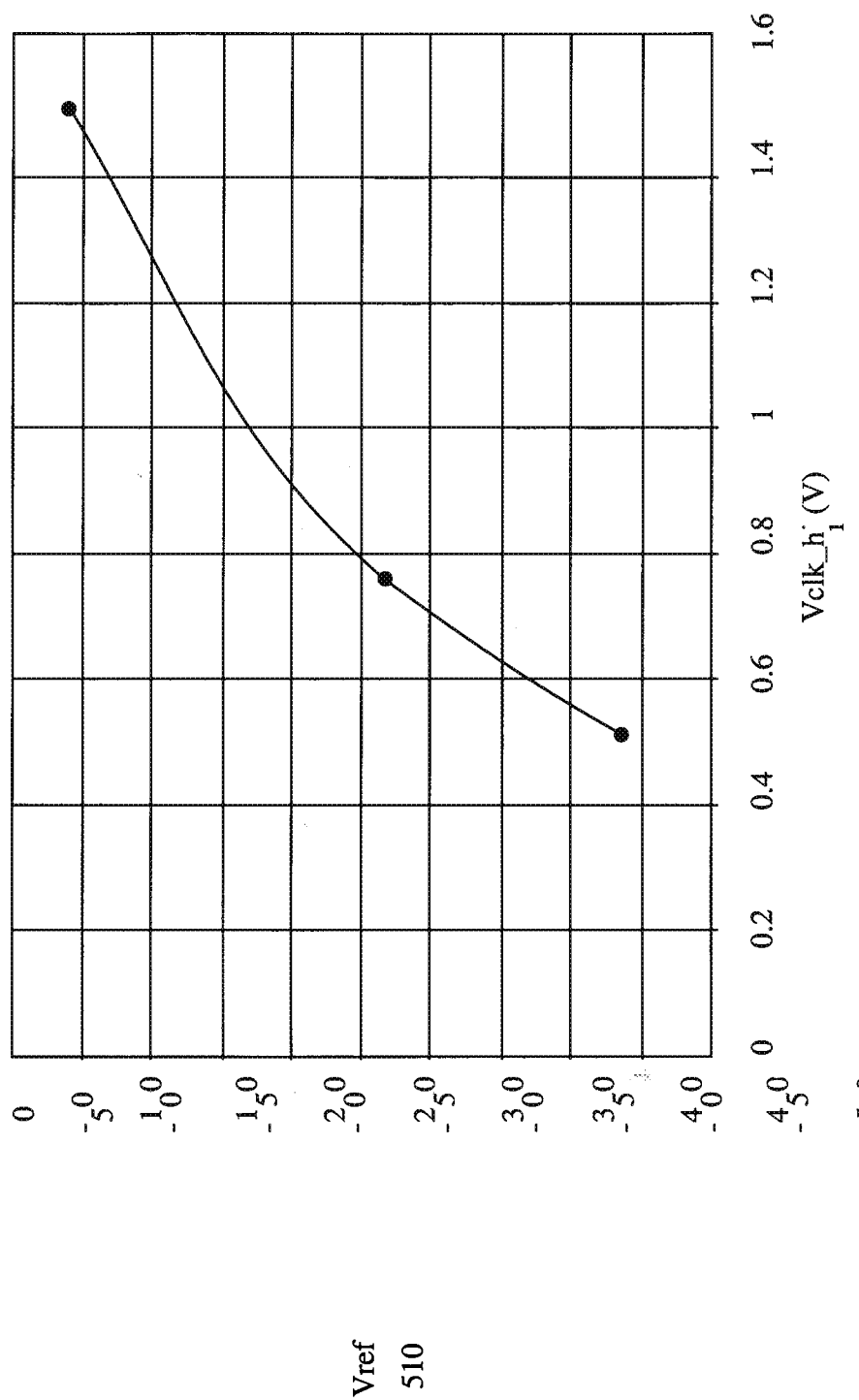
FIG. 9 shows the threshold voltage of the TCT as a function of the clock logic-high values.

FIG. 9 summarizes the results of Vref tuning simulations shown on FIGS. 8A-8D by plotting the obtained reference voltage Vref 510 values against the logic-high value Vclk_hi 345 of the clock generator Clk 340. Generation of synchronized clocks of different logic-high levels can be achieved with a master generator and a resistor ladder.

Hysteresis is another factor that may deteriorate the ideal behavior of a comparator. Ideally, a comparator with a specific reference voltage should switch output logic state at the same analog input value independent of the history of the input values. For example, we expect that a ramp-up analog input and a ramp-down analog input cause the comparator to change state at same input voltage. In reality, there could be a small difference between the input voltages that cause a change of state on the way up and on the way down due to device physics. This phenomenon is called hysteresis.

Figure 10A:
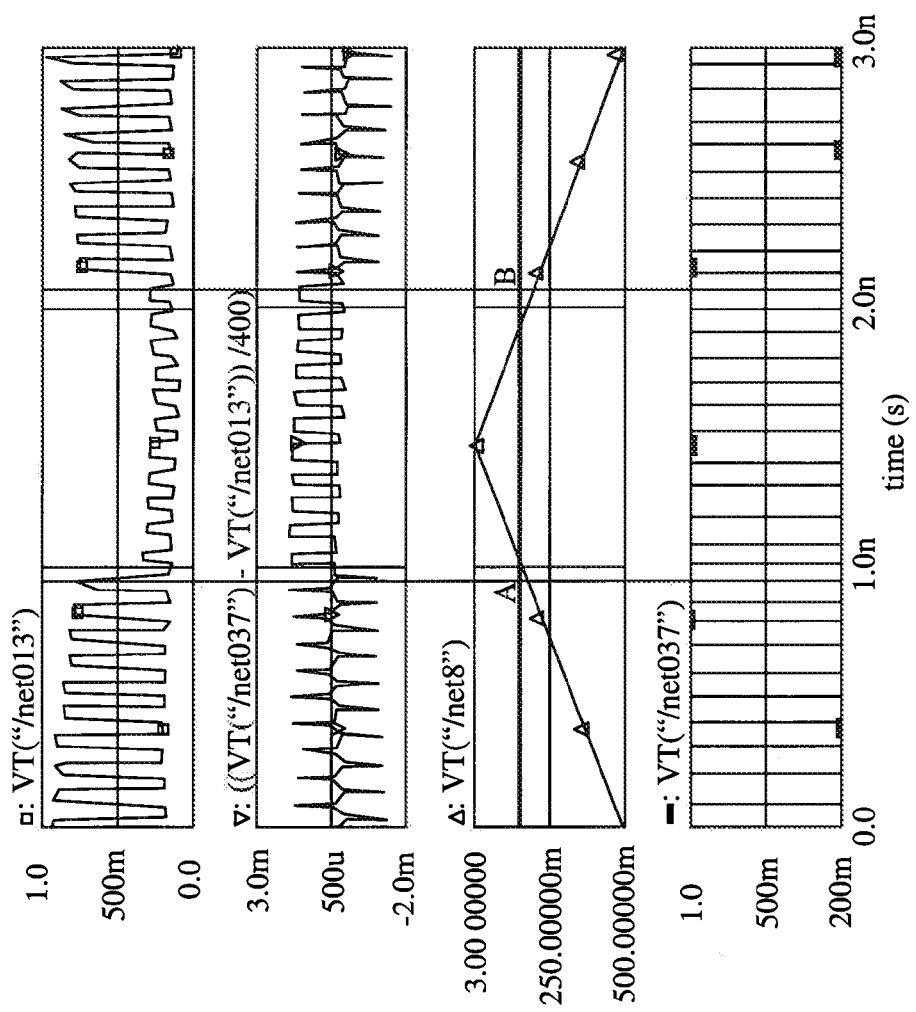
FIGS. 10A and 10B show SPICE® hysteresis simulation results of a TCT comparator at a time resolution of 50 pS.
Figure 10B:
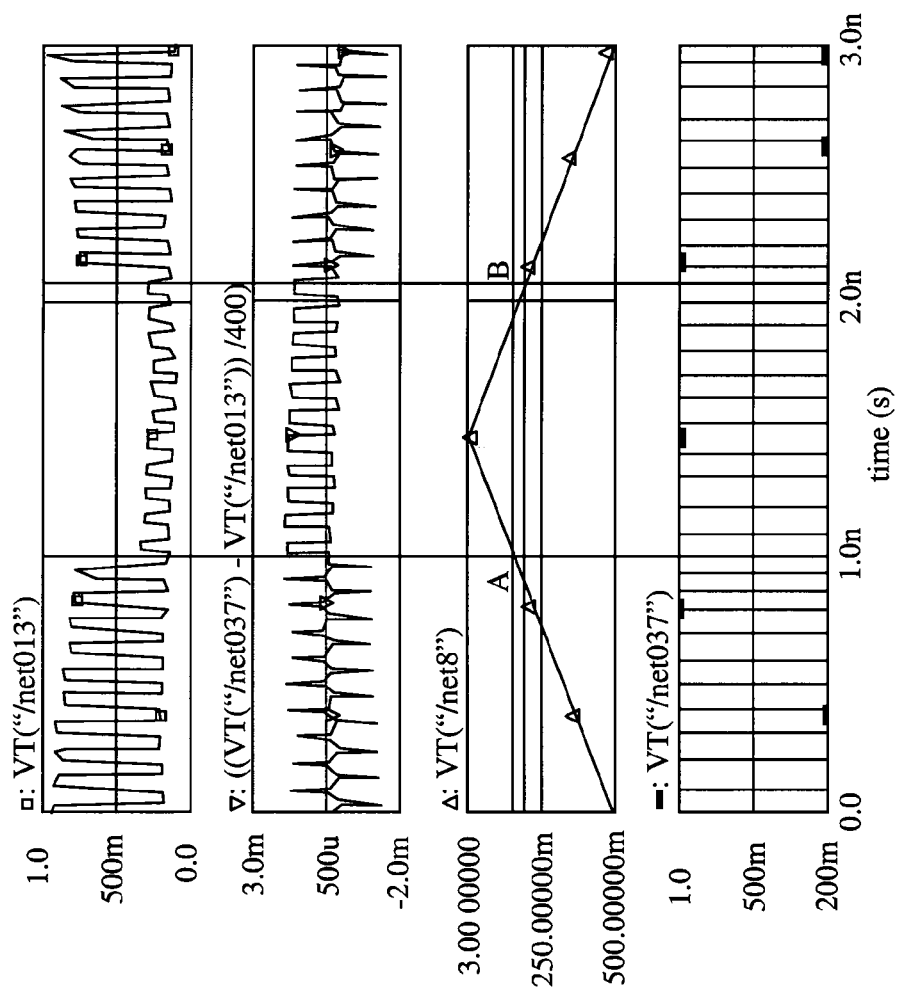
Figure 11A:
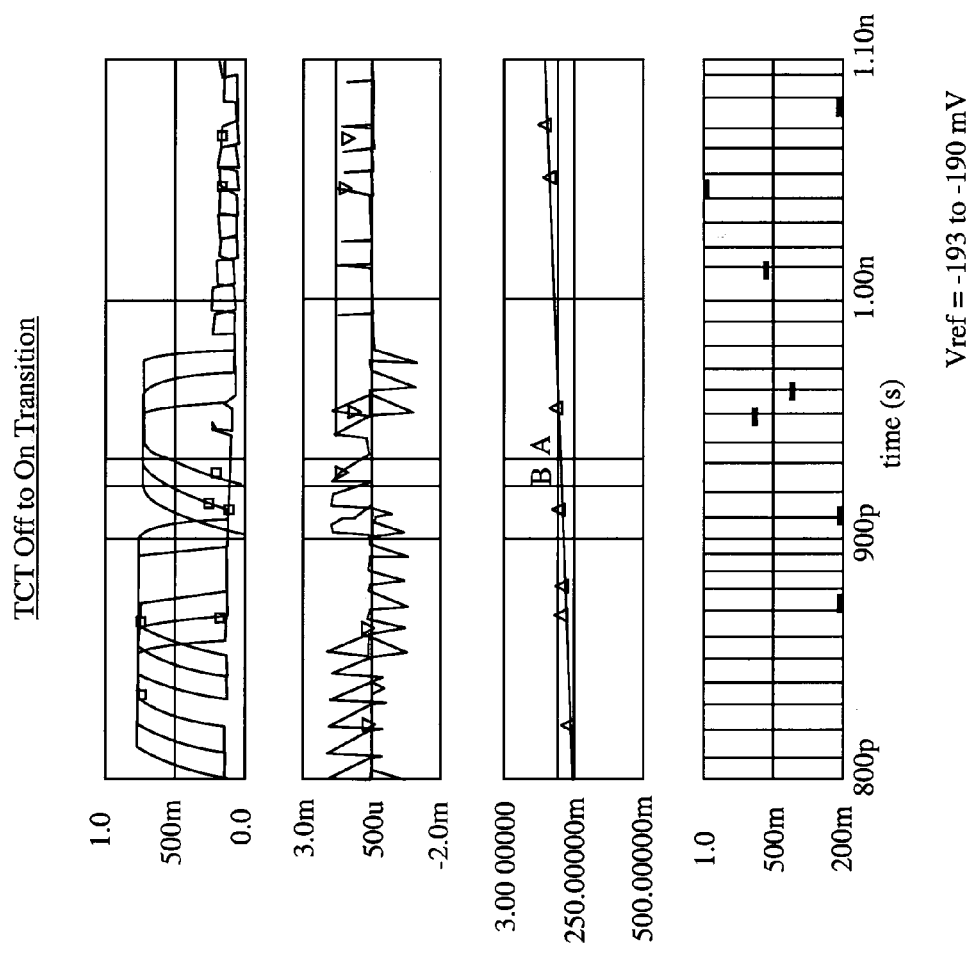
FIGS. 11A and 11B show SPICE® hysteresis simulation results of a TCT comparator at a time resolution of 10 pS.
Figure 11B:
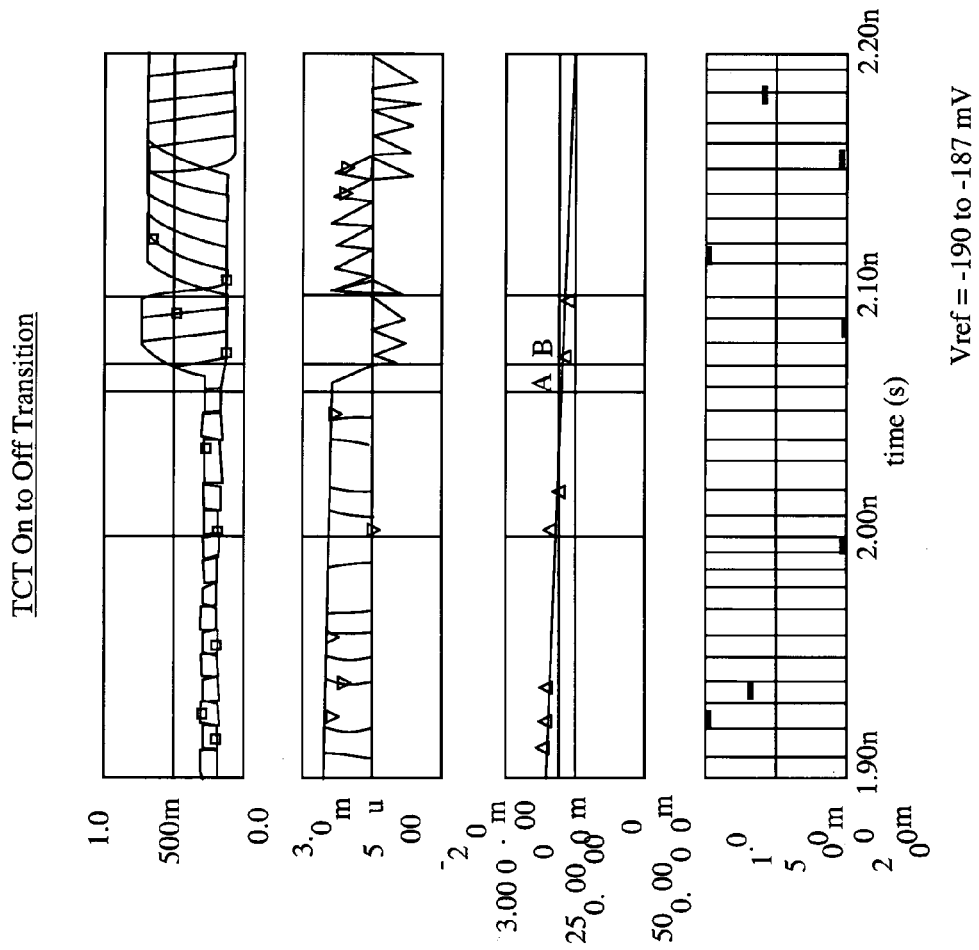
Figure 12A:
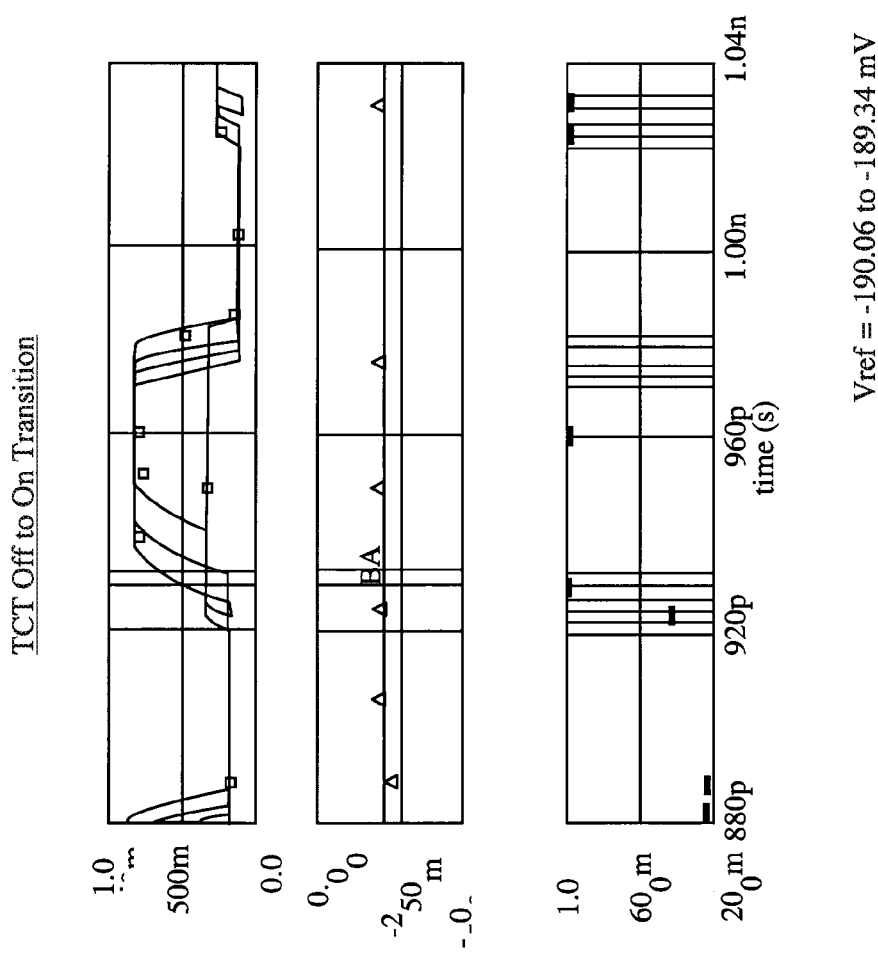
FIGS. 12A and 12B show SPICE® hysteresis simulation results of a TCT comparator at a time resolution of 2 pS.
Figure 12B:
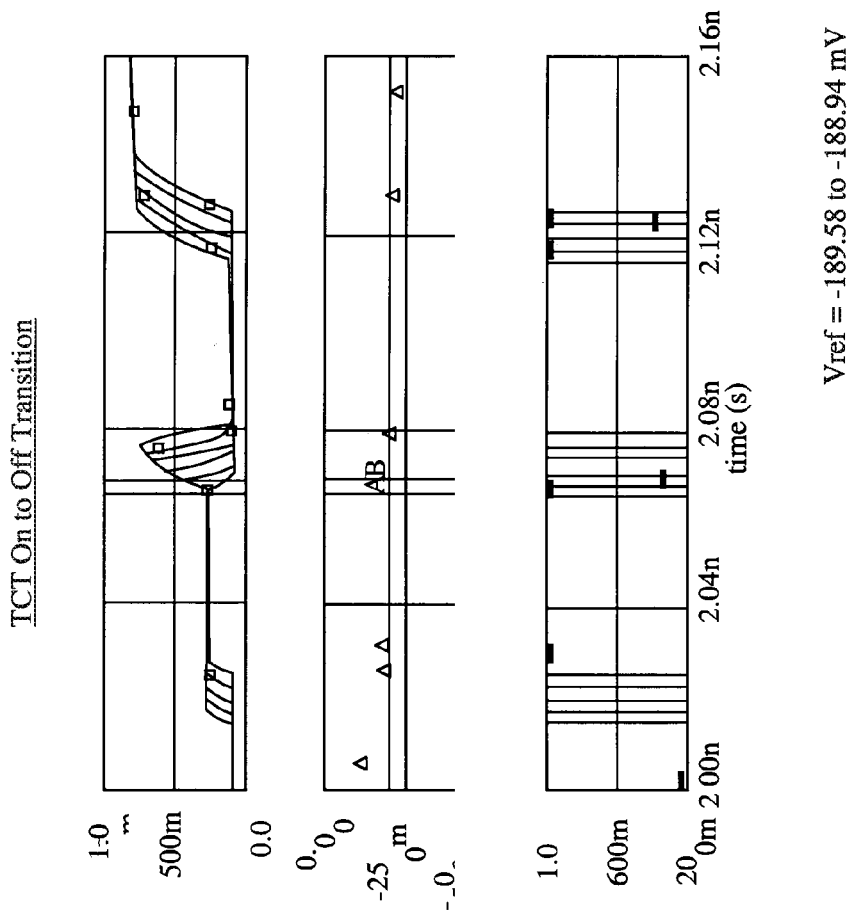

To assess the hysteresis, the TCT comparator operation was simulated with difference time resolutions. FIGS. 10A, 10B, 11A, 11B, and 12A, 12B show SPICE® simulation results for the TCT comparator 300 that were performed at time resolutions of 50 pS, 10 pS and 2 pS, respectively. Each of the figures include four waveforms, from top to bottom, corresponding to the output voltage Vc 350, the output current Ic 410, the input voltage Vg 330, and the clock generator 340. The sets of four waveforms appearing FIGS. 10A, 11A, and 12A represent the results when the input voltage Vg 330 ramps up and the TCT comparator 300 transitions from the off condition to the on condition. The sets of four waveforms appearing in FIGS. 10B, 11B, and 12B represent the results when input voltage Vg 330 ramps down and the TCT comparator 300 transitions from the on condition to the off condition.

The hysteresis analysis results indicate that the hysteresis, excluding temperature effects, is less than 1.12 mV at a time resolution of 2 pS. The temperature effects can cause additional hysteresis.

An embodiment of voltage comparator 330 of the invention includes a TCT coupled to a resistor. The comparator 330 is capable of operating well above 10 Giga-samples-per-second (GS/s). The comparator consumes only about 1 mW of power, excluding power required for clock generation. The power consumption of the comparator 330 is independent from the sampling rate. The threshold voltage or reference voltage Vref 510 of the comparator is controllable by adjusting the pulse height Vclk_hi of the clock signal. The hysteresis of the device is estimated to be about 1 mV.

An embodiment of the TCT comparator 300 of the invention is capable of 10 to 100 times reduction in power consumption when compared with conventional comparators. This analysis excludes power consumption required for clock generation. The comparator of the invention, therefore, can drastically reduce power use of ICs that use many comparators and one master clock generator, such as analog-to-digital converters (ADCs).

An embodiment of the comparator 300 of the invention uses about 10 times fewer components and occupies about 10 times less area.

An embodiment with minimum capacitance of 8 fF may operate at clock frequencies of up to 100 GHz. With this configuration, average power, excluding clock generation, is approximately 1 mW and the power consumption is independent of the clock frequency. The hysteresis effects, excluding temperature effects, may be less than 1.12 mV.

An embodiment of the invention includes a novel method of tuning the reference (threshold) voltage of the comparator by varying the logic-high voltage Vclk_hi 345 of the clock. Varying this parameter changes the location of the load line 440 and where the peak tunneling current Ic 410 intersects the load line 440. Each peak tunneling current Ic 411, 412, 413 corresponds to a different gate voltage Vg 330. This method allows tuning of the reference voltage Vref 510 of a TCT comparator 300.

Embodiments of the invention are suitable for high-speed, ultra-low power, and medium-resolution (8-10 bit) ADCs. Potentially, the TCTs can be integrated monolithically with InP HBTs or other III-V devices. A Silicon or SiGe based TCT and comparator may also be developed with a greater impact on computing industry.

Figure 13:
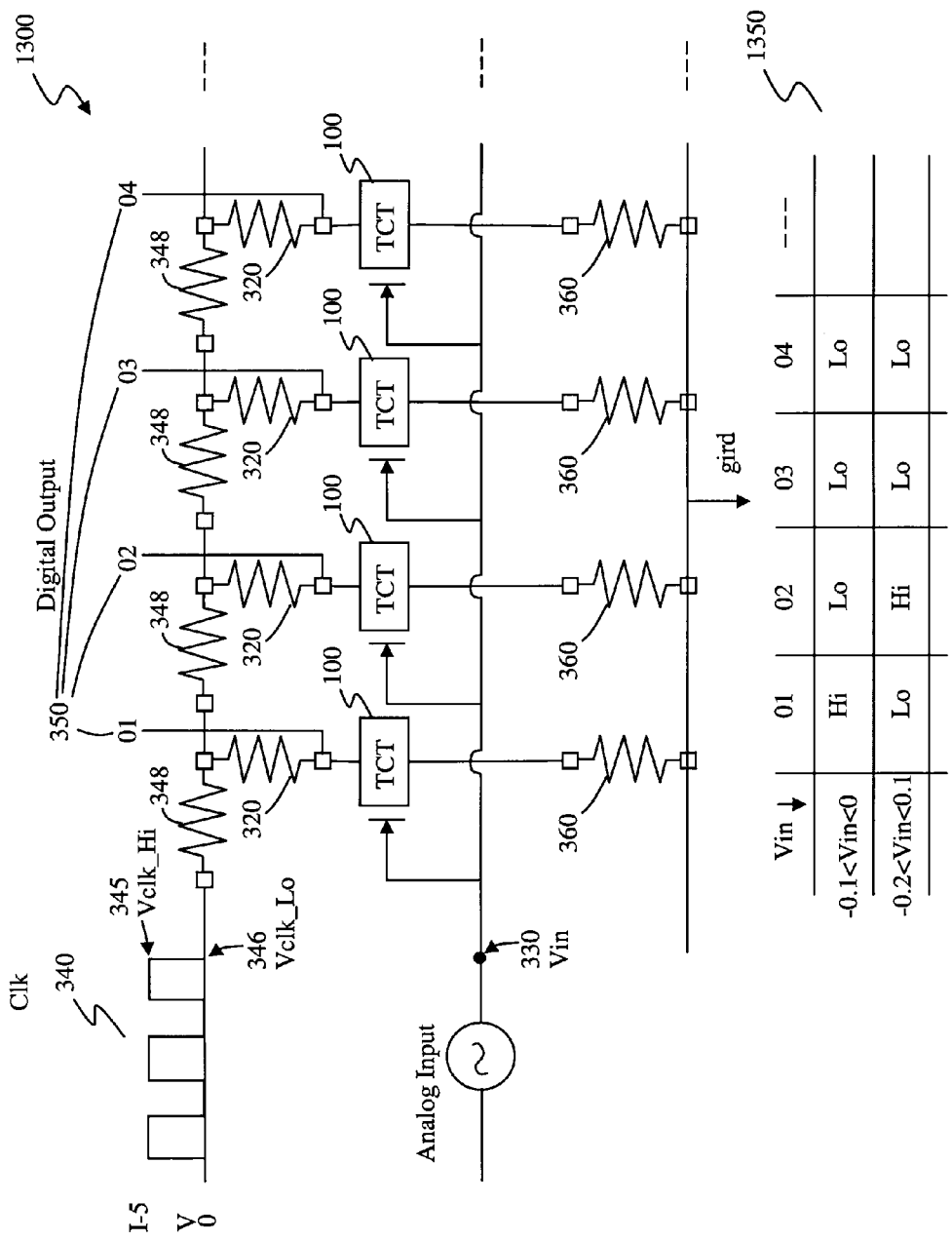
FIG. 13 shows an exemplary implementation of the TCT comparator of the invention into a clock height distribution network of an ADC.

FIG. 13 shows an exemplary implementation of the comparator 300 of the invention in an ADC 1300. ADC 1300 has a clock height distribution network such that a clock signal of a constant logic-high Vclk-hi 345 value of for example 1.5V may be distributed through a network of distributive resistors 348.

In the exemplary embodiment of FIG. 13, load resistors 320 are coupled between the distributive resistors 348 and may have an exemplary value of 400Ω.

The network of distributive resistors 348 causes the clock signal to apply progressively reducing fractions of the constant logic-high Vclk-hi 345 value to a number of TCTs 100 with similar characteristics. This is equivalent to reference voltage Vref 510 tuning shown in FIG. 9. As a result, each TCT 100 of the ADC 1300 will receive a different Vref 510 and will respond to a different level of input analog signal Vg 330. A table 1350 shown on FIG. 13 shows how each TCT 100 output Vc 350 will be high at a certain range of input voltages Vg 330 and low at the other voltage ranges.

In the exemplary embodiment shown, a network of tail resistors 360 couples each of the TCTs to ground. The tail resistors 360 may each have an exemplary value of 1 mΩ.

As seen in the figure, only one transistor TCT 100 need be used for each comparator thus reducing parasitic capacitance and resistance effects and increasing the speed or sampling rate of the ADC 1300. The use for fewer transistors also yields a more compact device and lower power requirements.

The current-voltage characteristics of the TCT are highly nonlinear and make this transistor uniquely desirable for switching-based applications such as ADCs. Embodiments of the current invention include comparators incorporating the TCT.

In an exemplary embodiment, a comparator is provided that uses only a single TCT transistor for each digitized voltage range and therefore drastically reduces the total number of transistors required for a comparator circuit. Reducing the number of transistor reduces the parasitics associated with each transistor and further increases the conversion rate of the ADC.

The TCT comparator of this invention can displace current-mode logic (CML) comparators implemented with Indium Phosphate heterojunction bipolar transistors (InP HBTs) or Antimonide-Based Compound Semiconductor heterojunction bipolar transistors (ABCS HBTs). As compared with the TCT comparator of the invention, CML comparators typically include 5 times more components, consume about 10 to 100 times more power depending on sampling rate, and occupy about 10 times more area.

The TCT comparators of the invention are suitable for compact, high-speed, ultra-low power, and medium resolution (8-10 bit) ADCs. Such ADCs are generic key components in many systems, such as radars, mobile terrestrial and extra-terrestrial communication terminals, and portable instruments among others.

Although the present invention has been described with reference to certain exemplary embodiments, it is understood that a variety of modifications and variations may be made to the present invention without departing from the spirit or scope of the invention defined in the appended claims, and their equivalents.

What is claimed is:

1. A low power voltage comparator comprising:
    a quantum tunneling coupled transistor having a collector terminal, a source terminal and a gate terminal, the quantum tunneling coupled transistor operating by gate terminal control of interlayer tunneling between two separate two-dimensional electron gas layers independently coupled to the source terminal and the gate terminal; and
    a load resistor coupled to the collector terminal,
    wherein the comparator receives an input voltage at the gate terminal of the quantum tunneling transistor and provides an output voltage at the source terminal of the quantum tunneling transistor, and
    wherein the output voltage of the comparator changes from a first level to a second level different from the first level when the input voltage of the comparator exceeds a reference voltage of the quantum tunneling coupled transistor.

2. The voltage comparator of claim 1, wherein the load resistor is about 400Ω.

3. The voltage comparator of claim 1, wherein the load resistor is coupled to a clock generator and wherein the reference voltage is adjustable according to the clock generator high voltage level.

4. The voltage comparator of claim 3, wherein the clock generator has a high voltage level of 1V and a low voltage level of 100 mV.

5. The voltage comparator of claim 3, wherein the clock generator is operated at a rate of 100 GHz.

6. A method for tuning a reference voltage of a low power voltage comparator, the voltage comparator including a quantum tunneling coupled transistor, the quantum tunneling coupled transistor having a collector terminal, a source terminal and a gate terminal, the quantum tunneling coupled transistor operating by gate terminal control of interlayer tunneling between two separate two-dimensional electron gas layers independently coupled to the source terminal and the gate terminal, the comparator receiving an input voltage at the gate terminal of the quantum tunneling coupled transistor and a clock signal at the collector terminal of the quantum tunneling coupled transistor, the comparator switching at the input voltage above the reference voltage, the method comprising:
    tuning the input voltage for varying a collector to source current of the quantum tunneling coupled transistor; and
    tuning a logic-high level of the clock signal for moving a load line of the quantum tunneling coupled transistor,
    wherein the reference voltage corresponds to an intersection of a current peak and a load line.

7. The method of claim 6, wherein the logic-high level of the clock is 1V.

8. The method of claim 6, wherein the comparator further includes a load resistor coupled to the quantum tunneling coupled transistor, and wherein the load resistor has a value of about 400Ω.

9. The method of claim 6, wherein the clock is operated at a rate of about 10 GHz.

10. The method of claim 6, wherein the clock is operated at a rate of about 50 GHz.

11. The method of claim 6, wherein the clock is operated at a rate of about 100 GHz.

12. A low power analog to digital converter comprising:
    a network of quantum tunneling coupled transistors coupled together, each of the quantum tunneling coupled transistors having a collector terminal, a source terminal and a gate terminal, the quantum tunneling coupled transistor operating by gate terminal control of interlayer tunneling between two separate two-dimensional electron gas layers independently coupled to the source terminal and the gate terminal;
    a network of distributive resistors, each distributive resistor coupling together two adjacent quantum tunneling coupled transistors;
    a network of tail resistors, each tail resistor coupled between one of the quantum tunneling coupled transistors and ground; and
    a network of load resistors, each load resistor coupled between one of the quantum tunneling coupled transistors and one of the distributive resistors,
    wherein the network of distributive resistors is adapted for receiving an input voltage and providing progressively reducing fractions of the input voltage as a reference voltage to the quantum tunneling coupled transistors, and
    wherein each quantum tunneling coupled transistor is adapted to receive an analog input at the gate terminal and to produce a digital output at the collector terminal.

\* \* \* \* \*